(12) United States Patent
Murayama

(10) Patent No.: US 11,249,401 B2
(45) Date of Patent: Feb. 15, 2022

(54) POSITION DETECTION APPARATUS, POSITION DETECTION METHOD, LITHOGRAPHY APPARATUS, AND METHOD OF MANUFACTURING ARTICLE

(71) Applicant: CANON KABUSHIKI KAISHA, Tokyo (JP)

(72) Inventor: Genki Murayama, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/036,478

(22) Filed: Sep. 29, 2020

(65) Prior Publication Data

US 2021/0103226 A1 Apr. 8, 2021

(30) Foreign Application Priority Data

Oct. 4, 2019 (JP) .............................. JP2019-183925

(51) Int. Cl.
*G03F 7/20* (2006.01)
*H01L 23/544* (2006.01)
*G03F 9/00* (2006.01)

(52) U.S. Cl.
CPC .......... *G03F 7/70775* (2013.01); *G03F 7/705* (2013.01); *G03F 7/70491* (2013.01); *G03F 7/70616* (2013.01); *G03F 7/70625* (2013.01); *G03F 7/70633* (2013.01); *G03F 9/7019* (2013.01); *G03F 9/7073* (2013.01); *G03F 9/7088* (2013.01); *G03F 9/7092* (2013.01); *H01L 23/544* (2013.01)

(58) Field of Classification Search
CPC .. G03F 7/70491; G03F 7/705; G03F 7/70616; G03F 7/70625; G03F 7/70633; G03F 7/70775; G03F 7/7088; G03F 9/7088; G03F 9/7092
USPC ...... 355/53, 67, 68, 77; 356/237.5, 399–401
See application file for complete search history.

(56) References Cited

U.S. PATENT DOCUMENTS

| | | | |
|---|---|---|---|
| 2003/0174330 A1* | 9/2003 | Tanaka ................... | G03F 9/7092 356/401 |
| 2005/0220334 A1* | 10/2005 | Tanaka ................... | G03F 9/7088 382/151 |
| 2006/0126916 A1* | 6/2006 | Kokumai .............. | G03F 9/7076 382/151 |
| 2018/0059553 A1* | 3/2018 | Miyazaki .............. | G03F 7/7065 |
| 2018/0329294 A1* | 11/2018 | Tsujikawa ........... | G03F 7/70725 |

FOREIGN PATENT DOCUMENTS

JP 2003-338455 A 11/2003

* cited by examiner

*Primary Examiner* — Colin W Kreutzer
(74) *Attorney, Agent, or Firm* — Canon U.S.A., Inc. IP Division

(57) ABSTRACT

A position detection apparatus configured to detect a pattern including a plurality of pattern elements formed on an object includes a control unit configured to detect the pattern by performing pattern matching between a template including a plurality of feature points and the plurality of pattern elements. While, performing pattern matching, the control unit changes positions of the plurality of feature points such that a correlation between an image and the template is within a predetermined allowable range.

13 Claims, 8 Drawing Sheets

POSITION DETECTION APPARATUS, POSITION DETECTION METHOD, LITHOGRAPHY APPARATUS, AND METHOD OF MANUFACTURING ARTICLE

BACKGROUND

Field of the Disclosure

The present disclosure relates to position detection apparatuses, position detection methods, lithography apparatuses, and methods of manufacturing an article.

Description of the Related Art

In the manufacture of an article, such as a semiconductor device, micro electromechanical system (MEMS), color filter, or flat panel display, patterns formed on substrates have been reduced in size, and there are demands for accurate positioning (alignment) of a substrate.

In positioning a substrate, a method is used in which pattern matching is performed on a captured image of a mark on a substrate to detect the mark.

Japanese Patent Application Laid-Open No. 2003-338455 discusses a technique including performing optimization by automatically changing a shape of a template correspondingly to a change in shape of a predetermined mark, performing pattern matching, and detecting the mark, whereby erroneous detection of the mark is prevented and the mark is reliably detected.

In recent years, not only a mark but also a pattern including a shape of a depression and protrusion, and/or a hole of a substrate as a pattern element are detected to align the substrate in the post-process of a semiconductor device or the like. In this case, a captured image sometimes contains a plurality of pattern elements having a similar shape, and this makes it difficult to specify a position from a single pattern element alone. Thus, pattern matching is performed on the plurality of pattern elements contained in the captured image to specify a position.

Japanese Patent Application Laid-Open No. 2003-338455 discusses a technique of automatically changing a template in performing pattern matching on a captured image containing an individual mark. However, Japanese Patent Application Laid-Open No. 2003-338455 does not describe a technique of automatically changing a template in performing pattern matching on a captured image containing a pattern including a plurality of pattern elements.

SUMMARY

The present disclosure is directed to a position detection apparatus configured to detect a pattern including a plurality of pattern elements with great accuracy, a position detection method, a lithography apparatus, and a method of manufacturing an article.

According to an aspect of the present invention, a position detection apparatus configured to detect a pattern including a plurality of pattern elements formed on an object includes a control unit configured to detect the pattern by performing pattern matching between a template including a plurality of feature points and the plurality of pattern elements. While, performing pattern matching, the control unit changes positions of the plurality of feature points such that a correlation between an image and the template is within a predetermined allowable range.

Further features of the present disclosure will become apparent from the following description of exemplary embodiments with reference to the attached drawings.

DESCRIPTION OF THE EMBODIMENTS

Figure 1:
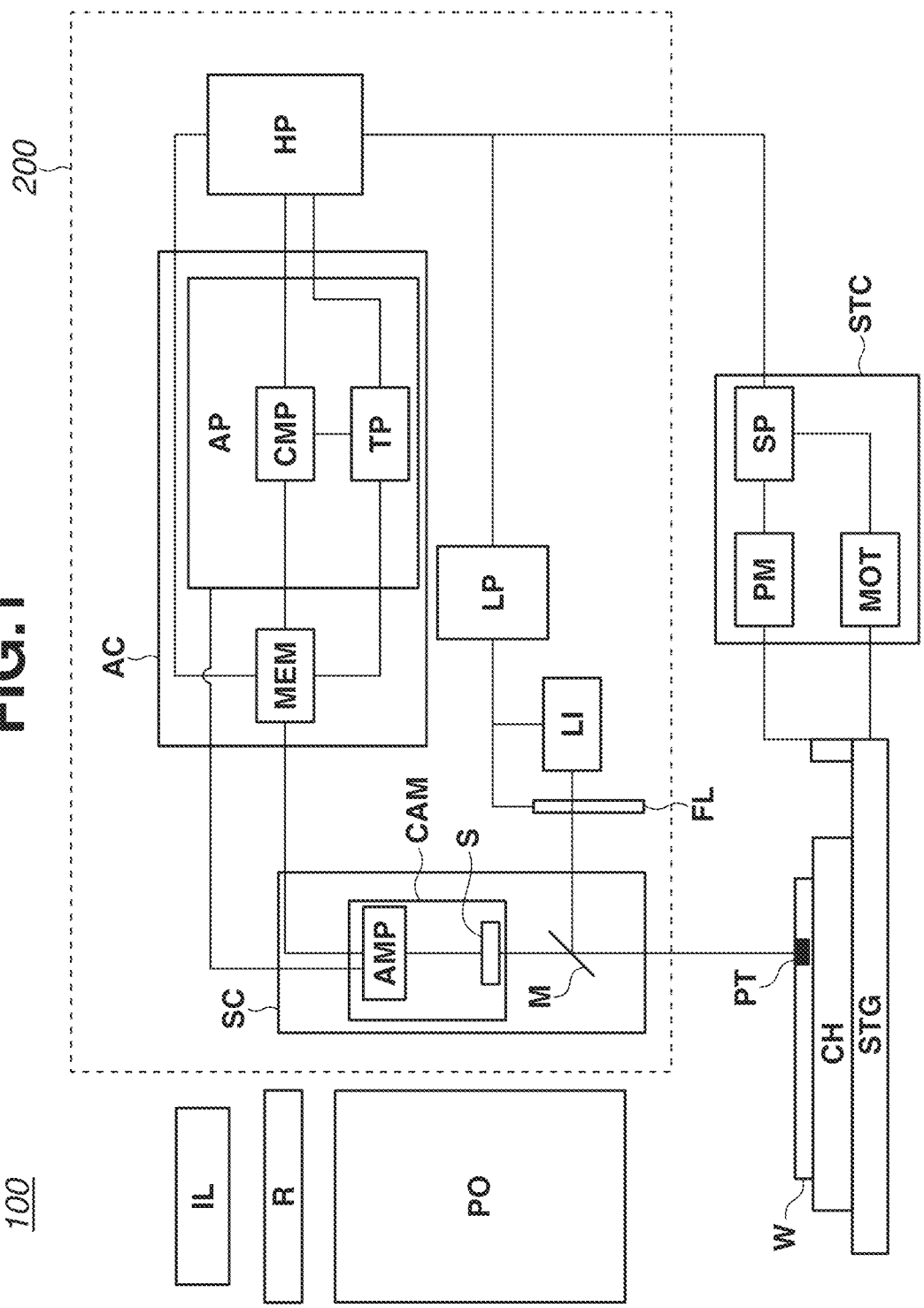
FIG. 1 illustrates an exposure apparatus including a position detection apparatus.

Various exemplary embodiments of the present invention will be described in detail below with reference to the drawings. In the drawings, similar members are given the same reference numeral, and overlapping descriptions are omitted. It should be noted that the exemplary embodiments disclosed herein are not intended to limit the scope of the present invention and illustrate mere specific examples that are advantageous for implementations of the present invention. Further, not every combination of features described in the exemplary embodiments below is always essential to a technical solution of the present invention.

A position detection apparatus according to a first exemplary embodiment of the present invention will be described below. FIG. 1 illustrates an exposure apparatus 100 including a position detection apparatus 200. The exposure apparatus 100 is a lithography apparatus for use in lithography in manufacturing semiconductor devices or liquid crystal display elements and forms a pattern on a substrate.

Hereinafter, a direction that is perpendicular to a holding surface of a substrate stage STG that holds and moves a substrate will be referred to as "Z-direction" (second direction), and two directions that are a direction (first direction) along a surface of the substrate and are orthogonal to each other will be referred to as "X-direction" and "Y-direction". Further, rotations about X-, Y-, and Z-axes will be referred to as "OX", "OY", and "OZ", respectively.

The exposure apparatus 100 according to the present exemplary embodiment includes an illumination system IL, a projection optical system PO, the substrate stage STG, and the position detection apparatus 200. The exposure apparatus 100 is an apparatus that aligns a reticle R, which is an original plate, and a substrate W and then illuminates the reticle R with exposure light using the illumination system IL so that a pattern of the reticle R is transferred onto the substrate W via the projection optical system PO.

The illumination system IL illuminates the reticle R with light from a light source. The projection optical system PO has a predetermined projection magnification (e.g., 1 time, ½ times) and projects a pattern formed on the reticle R onto the substrate W.

On the substrate stage STG is a chuck CH by which the substrate W is held (fixed). The substrate stage STG is a holding unit configured to hold and move the substrate W via the chuck CH. The substrate stage STG aligns the substrate W with the reticle R by moving the substrate W in the X-axis and Y-axis directions. The substrate stage STG is also movable in the Z-axis direction for focus adjustment of the exposure light. The substrate stage STG can further include a function of adjusting the position of the substrate W in the θZ direction (more desirably, θX, θY, and θZ directions) and a tilt function of correcting a tilt of the substrate W. Further, a host control unit HP adjusts the position of the substrate stage STG via a stage control unit STC based on a detected pattern PT.

The position detection apparatus 200 includes a scope SC, a measurement unit AC, and the host control unit HP. The position detection apparatus 200 detects the pattern PT formed on the substrate W (object).

The scope SC is an image capturing unit configured to capture an image of the pattern PT including shapes, such as a mark, depression/protrusion, and hole, formed on the substrate W and acquire the image including the pattern PT. The amount of light emitted from a light source LI is adjusted through a filter FL, such as a neutral density (ND) filter, and the adjusted light is guided by a fiber (not illustrated) and a dedicated optical system to a half mirror M and illuminates the pattern PT via a projection optical system (not illustrated). The light source LI and the filter FL are controlled by a light amount adjustment unit LP. The image of the pattern PT travels through the half mirror M and is projected onto a photo sensor S in a camera CAM for mark image capturing. The image of the pattern PT received by the photo sensor S is photoelectrically converted. At this time, the length of time to accumulate light is transmitted from the host control unit HP to a measurement processing unit AP in the measurement unit AC, which is a unit configured to calculate the position of the pattern PT and the light amount, and controlled by a sensor control unit AMP. Further, the timing to accumulate light is transmitted from a stage processing unit SP in the stage control unit STC to the measurement processing unit AP and transmitted as an instruction to the sensor control unit AMP. The stage processing unit SP drives the substrate stage STG using a motor MOT and measures the position using an interferometer PM. A signal that is photoelectrically converted by the photo sensor S undergoes analog/digital (A/D) conversion by the sensor control unit AMP, and the converted signal is output as an image that is digital signal information to the measurement unit AC.

The measurement unit AC includes a memory MEM and the measurement processing unit AP. The image of the pattern PT being a detection target that is output to the measurement unit AC is stored in the memory MEM. The measurement processing unit AP detects the pattern PT from the image stored in the memory MEM. Pattern matching is used as a method of detecting the pattern PT. Thus, first, a correlation between the image stored in the memory MEM and a template TP stored in the measurement processing unit AP is calculated by a computation unit CMP, and the calculated correlation is acquired. Then, the pattern PT in the first direction is detected based on the calculation result. The detected pattern PT is transmitted to the host control unit HP.

The pattern matching can be performed using an image acquired by binarizing an image captured by the photo sensor S including an accumulation type photoelectric conversion element. Alternatively, the pattern matching can be performed using an image containing grayscale information and the template TP containing grayscale information by a normalized cross correlation method.

Figure 2:
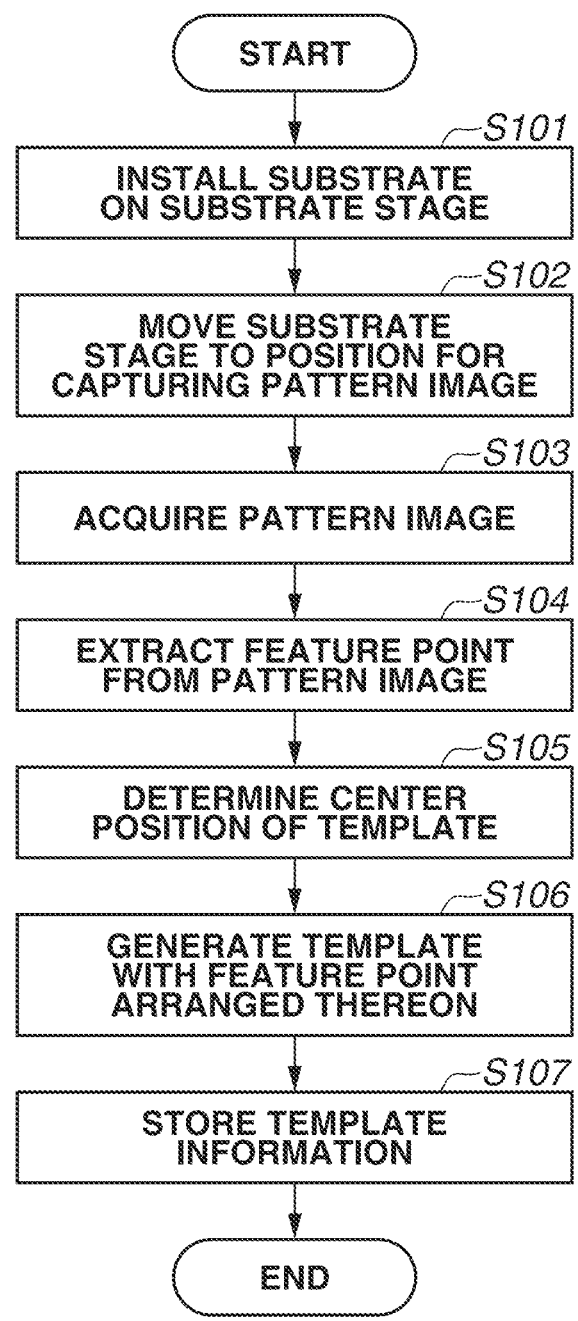
FIG. 2 is a flowchart illustrating a process of generating a template.

Next, a process of generating the template TP will be described below. FIG. 2 is a flowchart illustrating a process of generating the template TP. While the flowchart illustrates an example in which the steps are executed under control of the components by the host control unit HP, at least one of the steps can be executed not only by the host control unit HP but also by another information processing apparatus such as the measurement unit AC or the stage control unit STC.

In step S101, the host control unit HP installs the substrate W on the substrate stage STG using a substrate conveyance unit (not illustrated).

In step S102, the host control unit HP moves the substrate stage STG to a position where the scope SC captures an image of the pattern PT for generating the template TP. More specifically, the host control unit HP moves the substrate stage STG so that the pattern PT for generating the template TP is in a field of view of the scope SC.

In step S103, the host control unit HP captures an image of the pattern PT of the substrate W and acquires the image of the pattern PT. Image capturing conditions of the pattern PT are, for example, the amount of light to illuminate the pattern PT and a focus position, and the conditions are determined by previous image capturing. Further, the host control unit HP can acquire an image of the pattern PT that is captured by an external apparatus.

Figure 3:
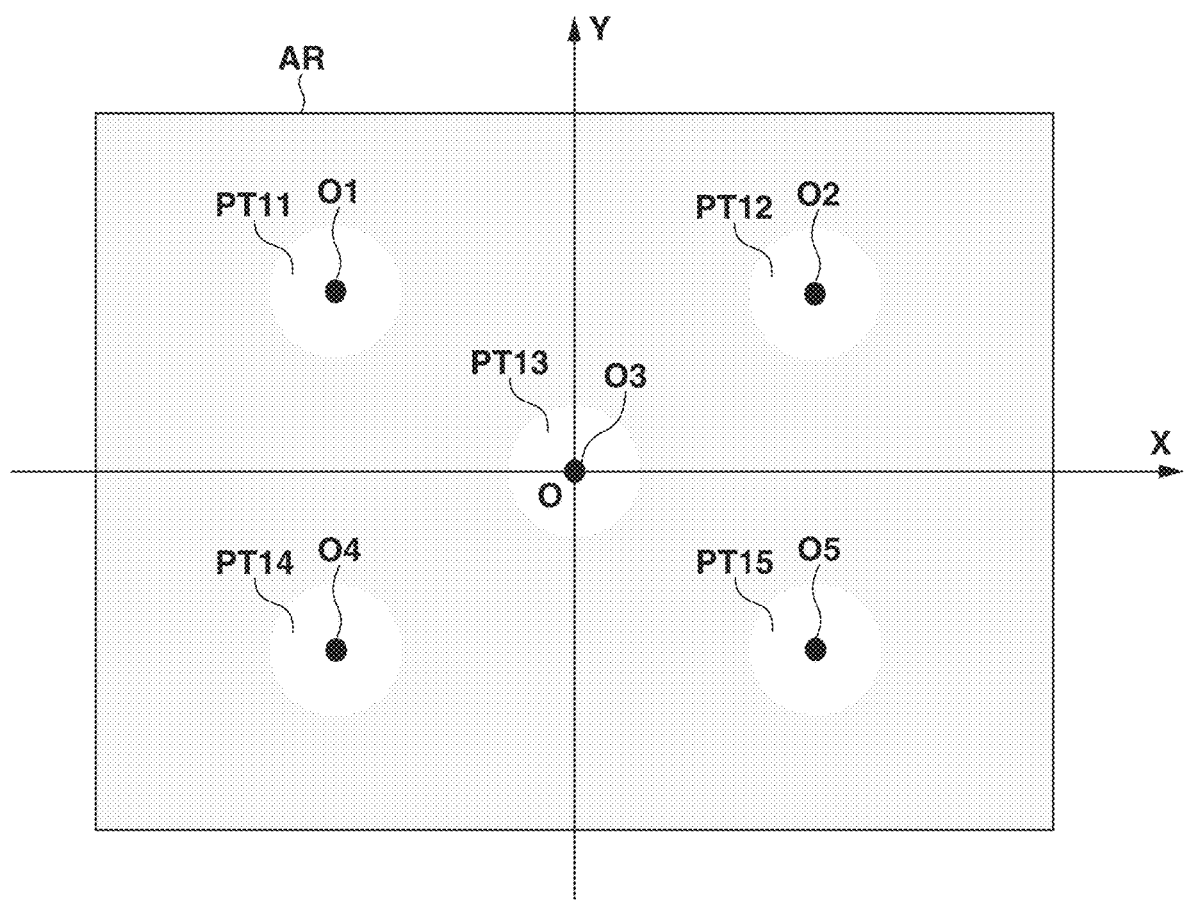
FIG. 3 illustrates an image containing a pattern that is a pattern matching target.

The pattern PT (design) that is a detection target will be described below. FIG. 3 illustrates an image containing the pattern PT that is a pattern matching target. In an XY coordinate system, the coordinates of a center O of the image are (0, 0). The pattern PT that is a detection target appears in a detection range AR of the captured image. In the example illustrated in FIG. 3, the pattern PT contains five pattern elements PT11 to PT15 (plurality of pattern elements, first to fifth pattern elements). While circular holes formed in the substrate W are described as an example of the pattern elements PT11 to PT15, the pattern elements PT11 to PT15 are not limited to holes. For example, the pattern elements PT11 to PT15 can be a mark or groove on or in the substrate W. Further, while the pattern elements PT11 to PT15 each appear in the shape of a circle in the captured image in the example illustrated in FIG. 3, the shapes of the pattern elements PT11 to PT15 are not limited to circles. Alternatively, the pattern elements PT11 to PT15 can each appear in a shape other than a circle, such as a semicircle, an ellipse, or a polygon such as a triangle or quadrangle, in the captured image. Further, the pattern elements PT11 to PT15 have an independent shape including a closed region in the captured image, and the pattern elements PT11 to PT15 have a different center or a different center of gravity. Thus, the pattern elements PT11 to PT15 have a similar shape and are at different positions in the captured image, so that it can be difficult to locate the pattern PT from a single pattern element alone.

Back to the description of FIG. 2, in step S104, the host control unit HP extracts each feature point at edges of the pattern elements PT11 to PT15 from the acquired image of the pattern PT. At this time, for example, a captured image of the pattern elements PT11 to PT15 is differentiated in the X- and Y-directions so that the feature point extraction is performed based on the image with each edge portion of the pattern elements PT11 to PT15 highlighted therein. The feature point extraction is performed based on signal intensities in the image with the highlighted edge portions and distances between feature points that are calculated from the total number of predetermined feature points. In the present exemplary embodiment, a feature point extraction method is not limited to the above-described method and can be any method by which a feature point indicating a feature of a pattern is extracted.

In step S105, the host control unit HP measures the positions of the pattern elements PT11 to PT15 in order to determine the position of the template TP. In order to determine a center PO of the template TP as the center of the pattern elements PT11 to PT15, the positions of centers O1 to O5 of the pattern elements PT11 to PT15 in circular shape in FIG. 3 are measured. The position of the center PO is measured by, for example, calculating the centers O1 to O5 of the pattern elements PT11 to PT15 based on their centers of gravity and acquiring a mean position of the positions of the centers O1 to O5 as a position of the plurality of pattern elements PT11 to PT15. A position that overlaps the position of the plurality of pattern elements PT11 to PT15 is determined as a position of the center PO of the template TP. Further, for example, a mean value of the position of an intermediate point O15 of the centers O1 and O5, the position of an intermediate point O24 of the centers O2 and O4, and the position of the center O3 of the pattern element PT13 can be determined as a position of the plurality of pattern elements PT11 to PT15.

In step S106, the host control unit HP generates the template TP on which the feature points are arranged with the center PO being the origin point based on the feature points extracted in step S104 and the position of the center PO that is determined in step S105.

Figure 4:
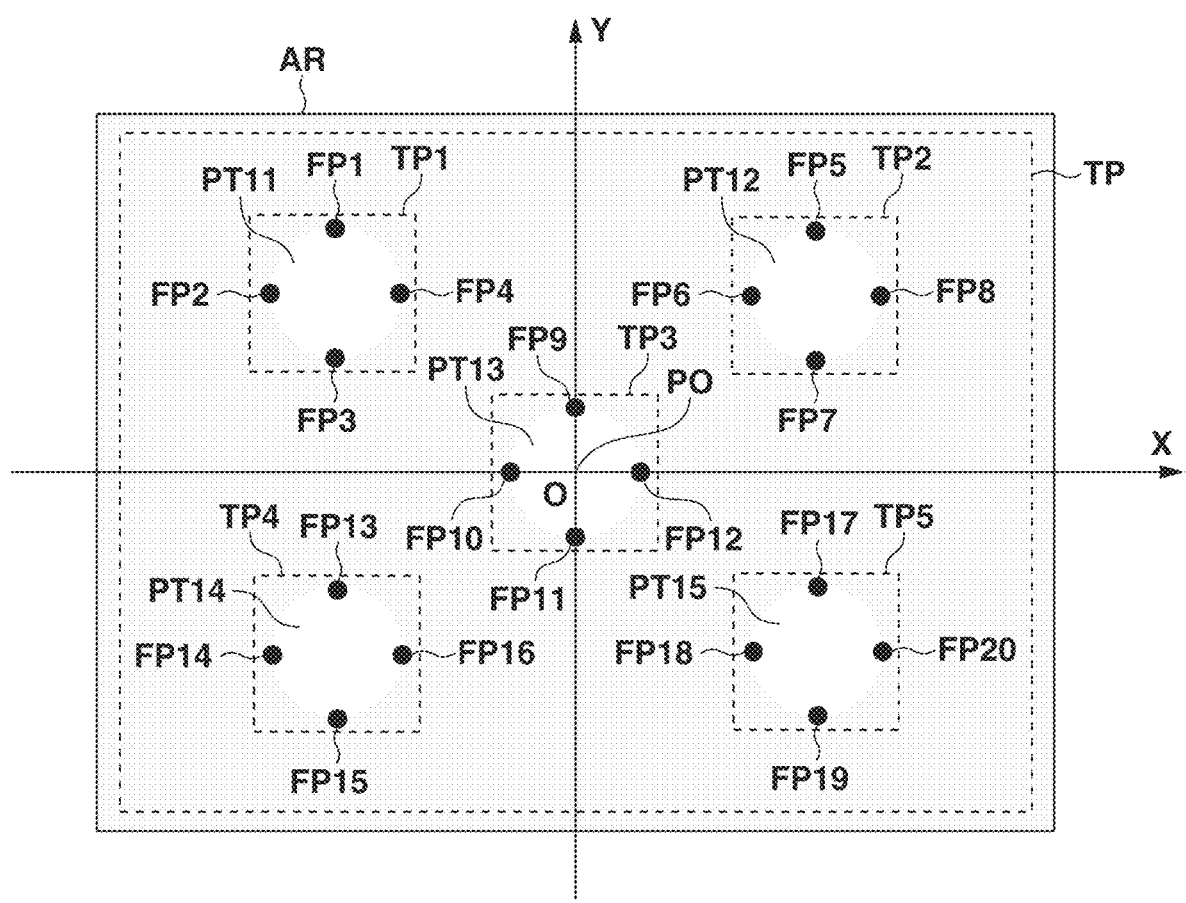
FIG. 4 illustrates a template with feature points arranged thereon.

The template TP will be described below. FIG. 4 illustrates the template TP on which the feature points are arranged. In FIG. 4, feature points FP1 to FP20 (plurality of feature points, first to twentieth feature points) are illustrated, and in order to prevent erroneous detection of the pattern PT, a plurality of feature points is arranged with respect to each of the pattern elements PT11 to PT15. Further, while four feature points are arranged with respect to each of the pattern elements PT11 to PT15 at respective edges of the pattern elements PT11 to PT15 in the example illustrated in FIG. 4, the number and positions of feature points are not limited to those described above. Further, the host control unit HP acquires information about which of the feature points FP1 to FP20 corresponds to which of the pattern elements PT11 to PT15. An example of a method of determining which of the pattern elements PT11 to PT15 a feature point corresponds to is a method that uses design information about the pattern elements PT11 to PT15 that is acquired in advance. The host control unit HP acquires a plurality of regions containing the respective pattern elements PT11 to PT15 from the design information about the pattern elements PT11 to PT15. Then, for example, a sub-template TP1 corresponding to the region that contains the pattern element PT11 is defined, and the feature points FP1 to FP4 are registered as feature points that correspond to the sub-template TP1. Similarly, sub-templates TP2 to TP5 are respectively defined for the pattern elements PT12 to PT15, and feature points that correspond to the sub-templates TP2 to TP5 are registered as illustrated in FIG. 4. Then, the host control unit HP determines to which of the pattern elements PT11 to PT15 a feature point corresponds based on which of the sub-templates TP1 to TP5 contains the feature point. In the example illustrated in FIG. 4, the positions of the pattern elements PT11 to PT15 are symmetrical about the center O of the image, so that the center PO of the template TP overlaps the center O of the image.

Back to the description of FIG. 2, in step S107, the host control unit HP stores information about the generated template TP in the memory MEM or a storage apparatus (not illustrated).

Further, in FIG. 2, the host control unit HP may not only generate a template and store the generated template in the memory MEM but also, for example, acquire information about the template TP generated by an external apparatus and store the acquired information in the memory MEM.

Figure 5:
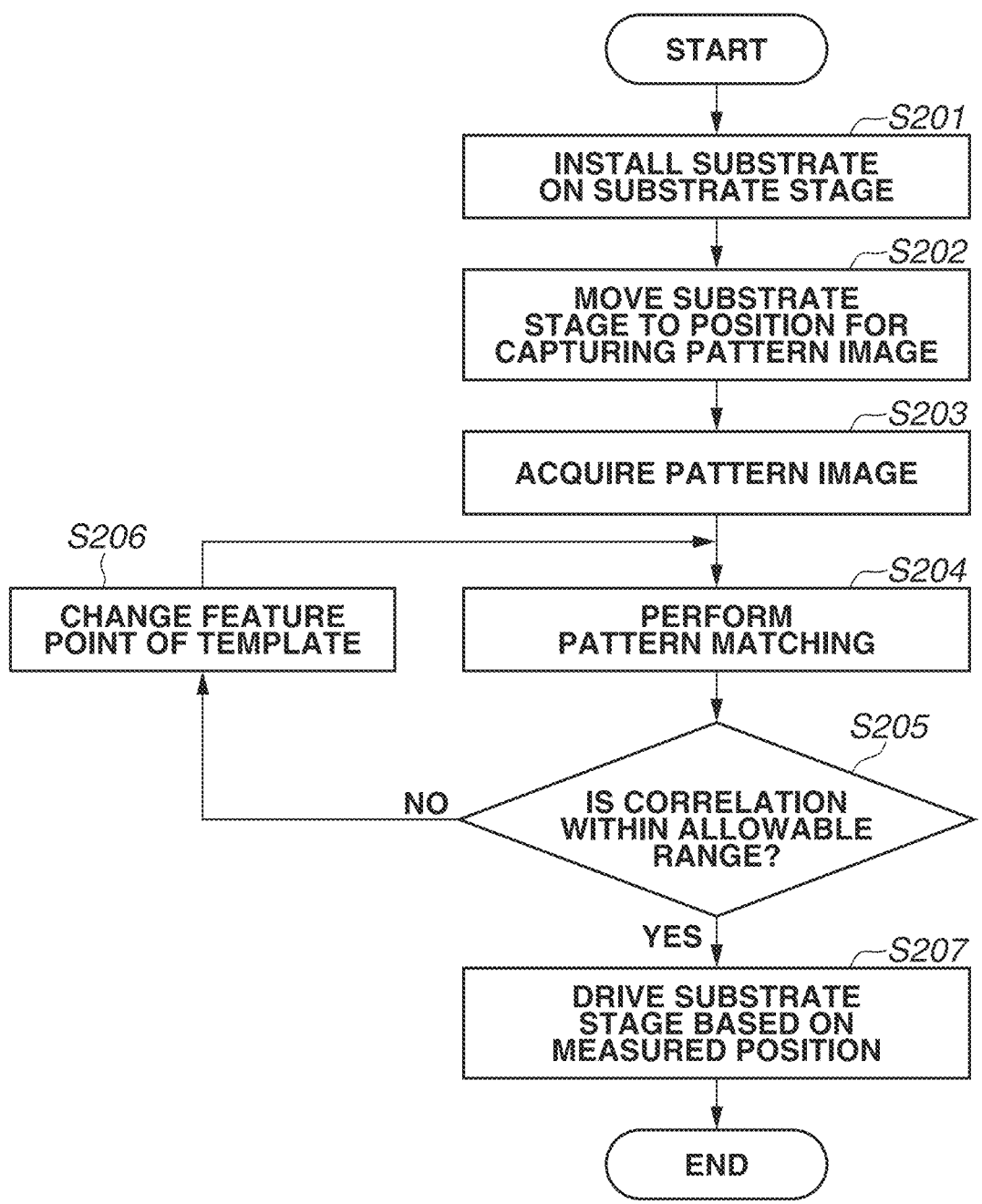
FIG. 5 is a flowchart illustrating a process of detecting a pattern using a template.

Next, a process of detecting a pattern using the template TP will be described below. FIG. 5 is a flowchart illustrating a process of detecting a pattern using the template TP. While the flowchart illustrates an example in which the steps are executed under control of the components by the host control unit HP, at least one of the steps can be executed not only by the host control unit HP but also by another information processing apparatus such as the measurement unit AC or the stage control unit STC.

In step S201, the host control unit HP installs the substrate W on the substrate stage STG using the substrate conveyance unit (not illustrated). The pattern PT is formed in advance on the installed substrate W by a process similar to a process by which the pattern PT is formed on the substrate W installed to generate the template TP in FIG. 2.

In step S202, the host control unit HP moves the substrate stage STG to a position where the scope SC captures an image of the pattern PT for detecting the pattern PT by pattern matching. More specifically, the host control unit HP moves the substrate stage STG so that the pattern PT for detecting the pattern PT by pattern matching is in a field of view of the scope SC.

In step S203, the host control unit HP captures an image of the pattern PT of the substrate W and acquires the image of the pattern PT. As in step S103, the image capturing conditions of the pattern PT are determined by previous image capturing.

In step S204, the host control unit HP performs pattern matching on the image acquired in step S203 using the information about the template TP that is stored in step S107. In the pattern matching, a correlation is calculated by the computation unit CMP while the template TP is moved to a plurality of positions in the detection range AR of the image acquired in step S203. For example, a correlation of the template TP at each of a plurality of positions is calculated while the template TP is sequentially moved in the X-axis and Y-axis directions in the image of the detection range AR. Information indicating a position and an edge direction is set to the plurality of feature points registered in the template TP. At each position of the plurality of feature points, whether there is in the image an edge that matches the information indicating the edge direction is determined. For example, in a case where there is an edge, a value is 100%, whereas in a case where there is no edge, a value is 0%, and a correlation is calculated based on the value calculated at each feature point. Then, the position with the highest correlation on the template TP among the correlations calculated at the plurality of positions on the template TP is detected as a position of the pattern PT.

Figure 6:
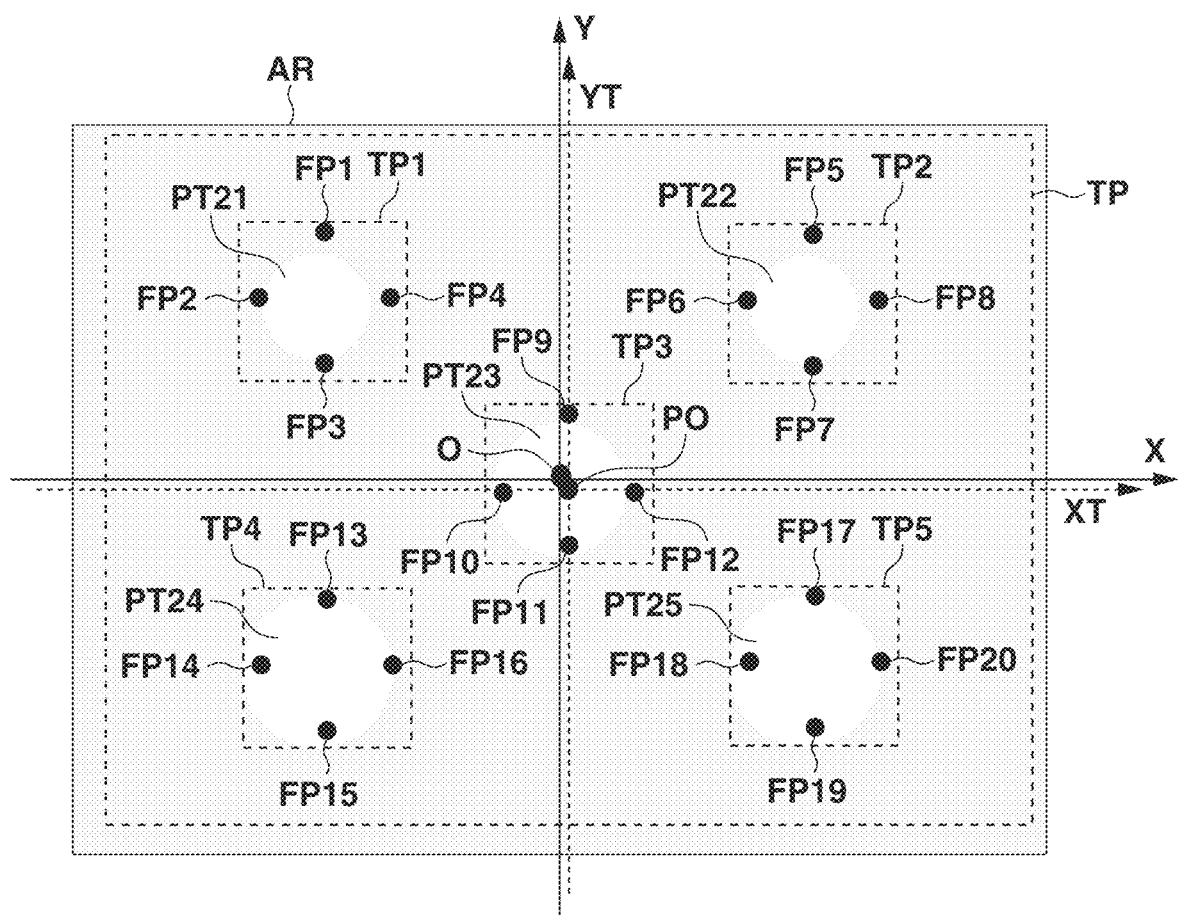
FIG. 6 illustrates a positional relationship between the template and the pattern.

A positional relationship between the template TP and the pattern PT during the pattern matching will be described below. FIG. 6 illustrates a positional relationship between the template TP and the pattern PT. Pattern elements PT21 to PT25 (plurality of pattern elements, first to fifth pattern elements) are based on the same design information as the pattern elements PT11 to PT15 with which the template TP is generated. However, the shapes of the pattern elements PT21 to PT25 may differ from the shapes of the pattern elements PT11 to PT15 when formed on the substrate W. Thus, there may be a case where none of the feature points of the template TP are on the edges of the pattern elements PT21 to PT25 and a calculated correlation is not within an allowable range. In such a case, even if the template TP is at the position with the highest correlation, although the actual center of the pattern PT is the center O, the center PO detected as the position of the template TP by pattern matching may be different from the center O. Furthermore, the positions of the X- and Y-axes through the center O of the pattern PT may be different from the positions of XT- and YT-axes through the center PO of the template TP.

Thus, in the present exemplary embodiment, a feature point position on the template TP is changed in a case where a correlation is not within the allowable range. Back to the description of FIG. 5, in step S205, the host control unit HP determines whether the highest correlation among the plurality of correlations calculated in step S204 is within the predetermined allowable range. In a case where the host control unit HP determines that the highest correlation is not within the predetermined allowable range (NO in step S205), in step S206, the host control unit HP changes a feature point position on the template TP. Details of step S206 will be described below. On the other hand, in a case where the host control unit HP determines that the highest correlation is within the predetermined allowable range (YES in step S205), in step S207, the host control unit HP controls driving of the substrate stage STG based on the pattern PT detected in step S204.

In processing a lot including a plurality of substrates W to be processed under the same condition, the processing of changing a feature point position on the template TP does not have to be performed on every substrate W. Specifically, the processing of changing a feature point position on the template TP is performed on some of the substrates W of the lot, and pattern matching is performed on the rest of the substrates W using the template TP with the feature points at the changed positions. For example, the processing of changing a feature point position on the template TP is performed on the substrate W to be processed first in the lot, and pattern matching is performed on the second and subsequent substrates W using the template TP with the feature points at the changed positions. In this way, the processing of changing a feature point position on the template TP is omitted, and the processing time of the substrate W is reduced.

Figure 7:
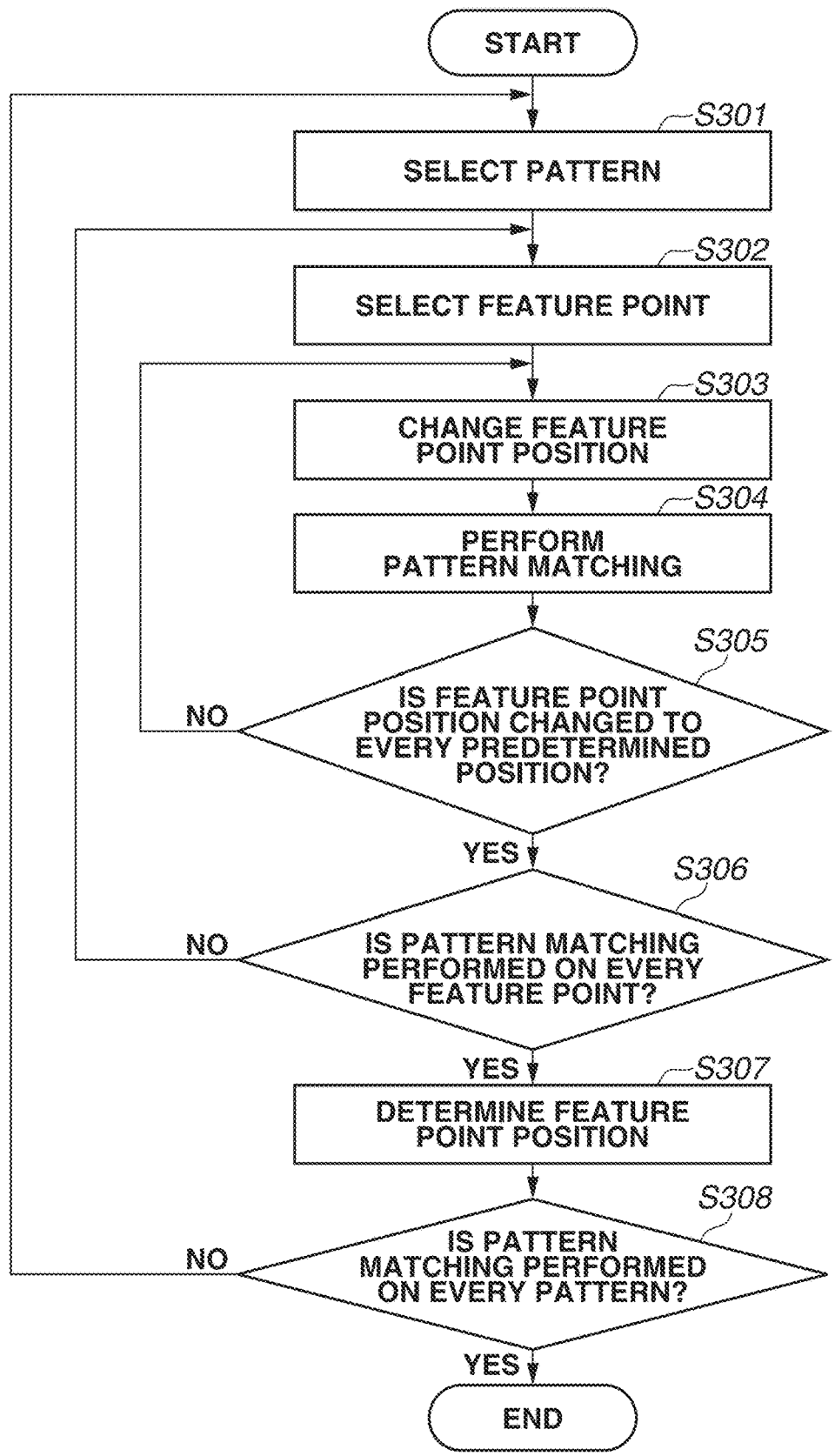
FIG. 7 is a flowchart illustrating a process of changing a feature point position on a template TP.

Next, the processing of changing a feature point position on the template TP in step S206 will be described below. FIG. 7 is a flowchart illustrating a process of changing a position of a feature point FP on the template TP. Further, the positioning (fine alignment) of the substrate stage STG can be performed thereafter by controlling the driving of the substrate stage STG based on the position of the pattern (mark) that is measured with greater accuracy than the position detected by pattern matching.

In step S301, the host control unit HP selects one of the plurality of patterns contained in the pattern PT. In the example illustrated in FIG. 6, the host control unit HP selects one of the pattern elements PT21 to PT25. Further, the host control unit HP can select the pattern elements PT21 to PT25 either sequentially or in random order. Further, the host control unit HP can select not all the pattern elements PT21 to PT25 but some of the pattern elements PT21 to PT25.

In step S302, the host control unit HP selects at least one or more of the plurality of feature points corresponding to the pattern selected in step S301. In FIG. 6, in a case where, for example, the pattern element PT21 is selected, at least one or more of the feature points FP1 to FP4 corresponding to the pattern element PT21 are selected. For example, the feature point FP1, the feature points FP1 and FP3, or the feature points FP1 to FP4 are selected. Further, a plurality of feature points FP or a combination of a plurality of feature points FP can sequentially be selected. For example, the feature points FP1 to FP4 can sequentially be selected, or a combination of the feature points FP1 and FP2 and a combination of the feature points FP3 and FP4 can sequentially be selected.

In step S303, the host control unit HP changes the position of the feature point FP selected in step S302 to a plurality of predetermined positions (first position, second position) on the template TP. At this time, the feature point FP is moved in a direction toward the center (center of gravity) of the pattern PT or a direction away from the center. For example, in a case where the position of the feature point FP1 is to be changed, a position of the feature point FP1 moved in a positive direction of the Y-axis and a position of the feature point FP1 moved in a negative direction of the Y-axis are predetermined. Further, in a case where, for example, the positions of the feature points FP1 and FP3 are to be changed, positions of the feature points FP1 and FP3 obtained by moving the feature point FP1 in the positive direction of the Y-axis and the feature point FP3 in the negative direction of the Y-axis and positions of the feature points FP1 and FP3 obtained by moving the feature point FP1 in the negative direction of the Y-axis and the feature point FP3 in the positive direction of the Y-axis are predetermined. Further, in a case where, for example, the positions of the feature points FP1 to FP4 are to be changed, a position of each feature point FP toward the center of the pattern element PT21 and a position of each feature point FP away from the center are predetermined. Furthermore, a distance by which a feature point FP is to be changed can be set to a predetermined distance for each feature point FP, or a plurality of positions to which a feature point FP is moved in the same direction by different distances can be predetermined. Further, a position of a feature point FP that is not changed may be predetermined.

In step S304, the host control unit HP performs pattern matching using the template TP with the feature points FP at the changed positions and detects the position of the pattern PT. Further, the host control unit HP stores information about the template TP with the feature points FP at the changed positions in association with information about the correlation at the time of the detection of the pattern PT, in the memory MEM or the storage apparatus (not illustrated).

In step S305, the host control unit HP determines whether the feature point FP is changed to every predetermined position and pattern matching is performed. In a case where the host control unit HP determines that the feature point FP is changed to every predetermined position (YES in step S305), the processing proceeds to step S306. On the other hand, in a case where the host control unit HP determines that the feature point FP is not changed to every predetermined position (NO in step S305), the processing returns to step S303.

In step S306, the host control unit HP determines whether every feature point FP or every combination of feature points FP is selected and pattern matching is performed. In a case where the host control unit HP determines that every feature point FP or every combination of feature points FP is selected (YES in step S306), the processing proceeds to step S307. On the other hand, in case where the host control unit HP determines that every feature point FP or every combination of feature points FP is not selected (NO in step S306), the processing returns to step S302.

In step S307, the host control unit HP determines the position of the feature point FP corresponding to the pattern PT selected in step S301 based on the information about the template TP and the corresponding information about the correlation that are stored in step S304. The position of the feature point FP corresponding to the selected pattern PT on the template TP that corresponds to the information about the correlation within the predetermined allowable range is determined as the position of the feature point FP corresponding to the selected pattern PT. More desirably, the position of the feature point FP corresponding to the selected pattern PT on the template TP that corresponds to the information about the highest correlation among the correlations within the predetermined allowable range is determined as the position of the feature point FP corresponding to the selected pattern PT. Further, in a case where the correlation acquired by the pattern matching in step S304 is within the predetermined allowable range, the position of the feature point FP can be determined at this point of time and the process can be ended. In this way, pattern matching does not have to be performed on the rest of the patterns, and changing the positions of the rest of the feature points or the rest of the combinations of feature points and performing pattern matching are unnecessary, so that the processing time is reduced.

In step S308, the host control unit HP determines whether every pattern PT is selected and pattern matching is performed on every pattern PT. In a case where the host control unit HP determines that every pattern PT is selected (YES in step S308), the process ends. On the other hand, in a case where the host control unit HP determines that every pattern PT is not selected (NO in step S308), the processing returns to step S301.

Figure 8:
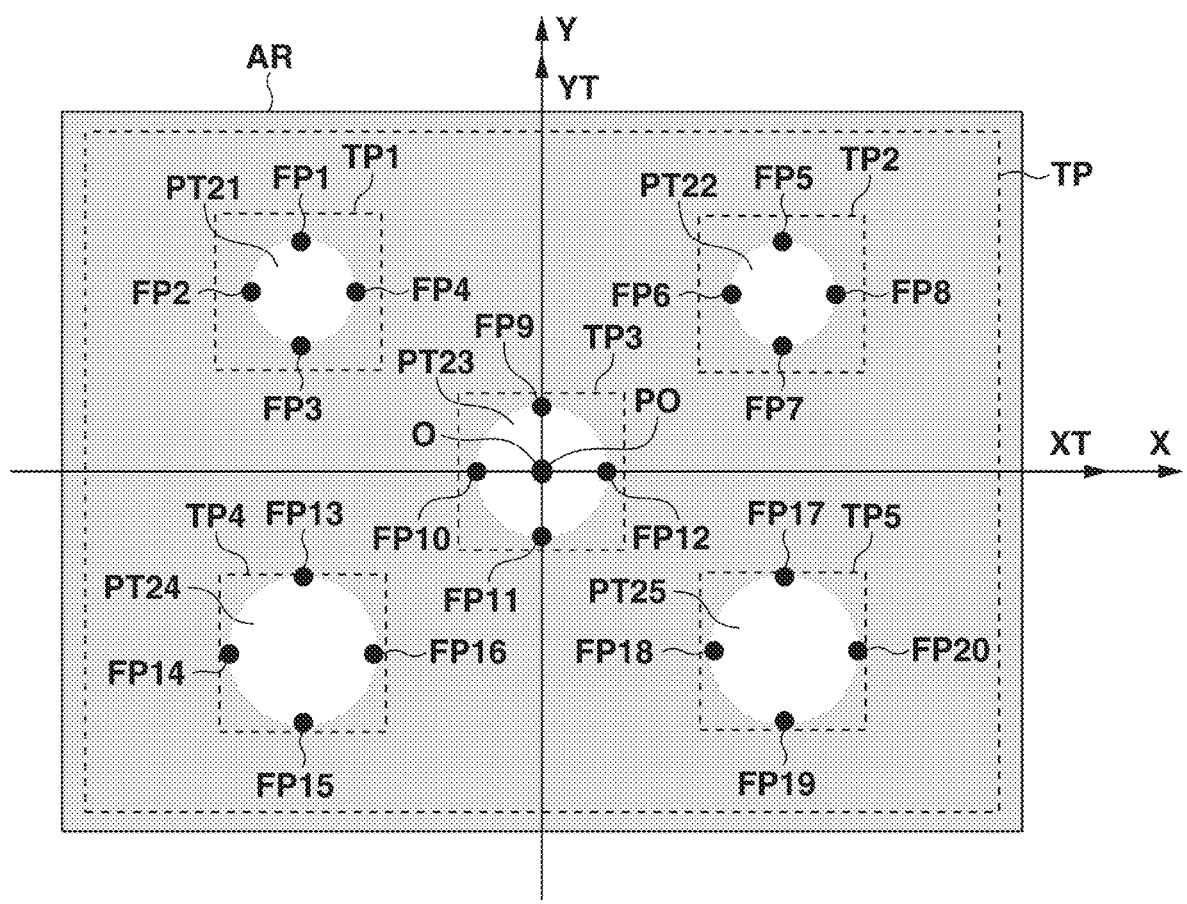
FIG. 8 illustrates a template with feature points at changed positions.

Next, the template TP with the feature points FP at the changed positions will be described below. FIG. 8 illustrates the template TP with the feature points FP at the changed positions. In the example illustrated in FIG. 8, pattern elements PT21 and PT22 are smaller in size than the pattern elements PT11 and PT12 in FIG. 3, so that the positions of the feature points FP1 to FP4 are changed in a direction toward a center of the pattern element PT21. Further, the positions of the feature points FP5 to FP8 are changed in a direction toward a center of the pattern element PT22. Further, the size of the pattern element PT23 is the same as the size of the pattern element PT13 in FIG. 3, so that the positions of the feature points FP9 to FP12 are not changed. Further, the pattern elements PT24 and PT25 are greater in size than the pattern elements PT14 and PT15 in FIG. 3, so that the positions of the feature points FP13 to FP16 are changed in a direction away from a center of pattern element PT24. Further, the positions of the feature points FP17 to FP20 are changed in a direction away from a center of the pattern element PT25. Then, as a result of the pattern matching using the template TP with the feature points FP at the changed positions, the distance between the center PO of the template TP and the center O of the pattern PT at the time of the detection of the pattern PT is shorter than the distance between the centers PO and O in FIG. 6. Specifically, the positions of the feature points FP are changed by the method illustrated in FIG. 7 so that the accuracy of the position detection by the pattern matching increases.

As described above, with the position detection apparatus according to the present exemplary embodiment, a pattern including a plurality of pattern elements is detected with great accuracy.

While the exposure apparatus is described as an example of a lithography apparatus, the lithography apparatus is not limited to it. Examples of a lithography apparatus also include an imprinting apparatus that forms a pattern of an imprint material on a substrate using a mold (cast, template) having a depression/protrusion pattern. Examples of a lithography apparatus also include a planarization apparatus that molds a composition on a substrate to planarize the composition using a mold (plane template) including a plane portion having no depression/protrusion patterns. Examples of a lithography apparatus also include a drawing apparatus that forms a pattern on a substrate by drawing the pattern on the substrate using a charged particle beam (electron beam, ion beam) via a charged particle optical system.

<Method of Manufacturing Article According to Exemplary Embodiment>

A method of manufacturing an article according to an exemplary embodiment of the present invention is suitable for use in manufacturing, for example, a microdevice such as a semiconductor device or an article such as an element having a fine structure. The method of manufacturing an article according to the present exemplary embodiment includes forming a pattern on a substrate using the lithography apparatus (exposure apparatus) and processing the substrate having the pattern formed thereon. The manufacturing method further includes other known processing (oxidation, deposition, evaporation, doping, planarization, etching, resist removal, dicing, bonding, packaging, and the like). The method of manufacturing an article according to the present exemplary embodiment is more advantageous than conventional methods in at least one of performance, quality, productivity, and production cost of an article.

While various exemplary embodiments of the present invention have been described, it is apparent that the present invention is not limited to the disclosed exemplary embodiments, and various modifications and changes are possible within the spirit of the present invention.

The present invention provides a position detection apparatus configured to detect a pattern including a plurality of pattern elements with great accuracy, a position detection method, a lithography apparatus, and a method of manufacturing an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-183925, filed Oct. 4, 2019, which is hereby incorporated by reference herein in its entirety.

What is claimed is:

1. A position detection apparatus configured to detect a pattern including a plurality of pattern elements formed on an object, the position detection apparatus comprising:
   a control unit configured to detect the pattern by performing pattern matching between a template including sub-templates each of which corresponds to one of the plurality of pattern elements and the image of the pattern,
   wherein the sub-templates include a plurality of feature points, and
   wherein, by changing positions of the plurality of feature points of the sub-templates each of which corresponds to one of the plurality of pattern elements, and performing the pattern matching repeatedly to the plurality of pattern elements, the control unit determines the positions of the plurality of feature points such that a correlation between the image of the pattern and the template is within a predetermined allowable range.

2. The position detection apparatus according to claim 1, wherein after the control unit changes a position of one of the plurality of feature points of a first sub-template that corresponds to a first pattern element and performs pattern matching, the control unit changes a position of another feature point of a second sub-template that corresponds to a second pattern element and performs pattern matching.

3. The position detection apparatus according to claim 1, wherein after the control unit changes a position of a first feature point of a first sub-template corresponding to a first pattern element and performs pattern matching, the control unit changes a position of a second feature point of a second sub-template corresponding to the first pattern element and performs pattern matching.

4. The position detection apparatus according to claim 1, wherein after the control unit changes a position of a first feature point of a first sub-template corresponding to a first pattern element and a position of a second feature point corresponding to the first pattern element and performs pattern matching, the control unit changes a position of a third feature point corresponding to the first pattern element and a position of a fourth feature point of a first sub-template corresponding to the first pattern element and performs pattern matching.

5. The position detection apparatus according to claim 1, wherein after the control unit changes a position of a first feature point of a first sub-template corresponding to a first pattern element to a predetermined first position and performs pattern matching, the control unit changes the position of the first feature point to a predetermined second position and performs pattern matching.

6. The position detection apparatus according to claim 1, wherein a position of one of the plurality of feature points on the template is determined in a case where a highest correlation among the plurality of correlations within the allowable range is acquired.

7. The position detection apparatus according to claim 1, wherein the control unit changes the positions of the plurality of feature points in a direction away from or toward a center or a center of gravity of the plurality of pattern elements corresponding to the plurality of feature points.

8. The position detection apparatus according to claim 1, further comprising an image capturing unit configured to capture an image of the plurality of pattern elements and acquire the image.

9. A position detection method for detecting a pattern including a plurality of elements formed on an object, the method comprising:
detecting the pattern by performing pattern matching between a template including sub-templates each of which corresponds to one of the plurality of pattern elements and the plurality of pattern elements,
wherein the sub-templates include a plurality of feature points, and
wherein, by changing positions of the plurality of feature points of the sub-templates each of which corresponds to one of the plurality of pattern elements, and performing the pattern matching repeatedly to the plurality of pattern elements, the positions of the plurality of feature points is determined such that a correlation between the image of the pattern and the template is within a predetermined allowable range.

10. A lithography apparatus configured to form a pattern on a substrate, the lithography apparatus comprising:
a stage configured to hold the substrate and move the substrate; and
a position detection apparatus configured to detect a pattern including a plurality of elements formed on the substrate,
wherein the stage is positioned based on the pattern detected by the position detection apparatus,
wherein the position detection apparatus includes a control unit configured to detect the pattern by performing pattern matching between a template including sub-templates each of which corresponds to one of the plurality of pattern elements and the image of the pattern,
wherein the sub-templates include a plurality of feature points, and
wherein, by changing positions of the plurality of feature points of the sub-templates each of which corresponds to one of the plurality of pattern elements, and performing the pattern matching repeatedly to the plurality of pattern elements, the control unit determines the positions of the plurality of feature points such that a correlation between the image of the pattern and the template is within a predetermined allowable range.

11. The lithography apparatus according to claim 10, wherein in a case where the pattern is formed on a plurality of substrates, the position detection apparatus determines the positions of the plurality of feature points corresponding to the plurality of pattern elements formed on at least one of the plurality of substrates.

12. The lithography apparatus according to claim 11, wherein in a case where the pattern is formed on a plurality of substrates that is to be processed under the same condition, the plurality of substrates being included in a lot, the position detection apparatus determines the positions of the plurality of feature points corresponding to the plurality of pattern elements formed on a substrate among the plurality of substrates included in the lot.

13. A method of manufacturing an article from a processed substrate, the method comprising:
detecting a pattern including a plurality of elements formed on the substrate by performing pattern matching between a template including sub-templates each of which corresponds to one of the plurality of pattern elements and the image of the pattern,
wherein the sub-templates include a plurality of feature points, and
wherein, by changing positions of the plurality of feature points of the sub-templates each of which corresponds to one of the plurality of pattern elements, and performing the pattern matching, repeatedly to the plurality of pattern elements, the positions of the plurality of feature points is determined such that a correlation between the image of the pattern and the template is within a predetermined allowable range;
positioning a stage configured to hold and move the substrate based on the detected pattern;
forming the pattern on the substrate held by the positioned stage; and
processing the substrate with the pattern formed thereon.

* * * * *